United States Patent [19]

Takahashi et al.

[11] Patent Number: 4,906,922

[45] Date of Patent: Mar. 6, 1990

[54] VOLTAGE MAPPING DEVICE HAVING FAST TIME RESOLUTION

[75] Inventors: Hironori Takahashi; Shinichiro Aoshima; Yutaka Tsuchiya, all of Shizuoka, Japan

[73] Assignee: Hamamatsu Photonics K. K., Shizuoka, Japan

[21] Appl. No.: 217,790

[22] Filed: Jul. 12, 1988

[30] Foreign Application Priority Data

Jul. 13, 1987 [JP] Japan ................... 62-174534
Jul. 13, 1987 [JP] Japan ................... 62-174535
Jul. 13, 1987 [JP] Japan ................... 62-174536

[51] Int. Cl.$^4$ ........................................ G01R 31/28
[52] U.S. Cl. ........................ 324/158 R; 324/96; 324/73.1
[58] Field of Search ............ 324/158 R, 96, 73 R, 324/117 R; 250/492.2, 356, 374, 376

[56] References Cited

U.S. PATENT DOCUMENTS

| | | | |
|---|---|---|---|
| 3,934,199 | 1/1976 | Channin | 324/158 R |
| 4,242,635 | 12/1980 | Burns | 324/73 R |
| 4,355,278 | 10/1982 | Burns et al. | 324/501 |
| 4,446,425 | 5/1984 | Valdmanis et al. | |
| 4,588,950 | 5/1986 | Henley | 324/158 R |
| 4,603,283 | 7/1986 | Mourou et al. | |
| 4,618,819 | 10/1986 | Mourou et al. | |
| 4,761,607 | 8/1988 | Shiragasawa et al. | 324/73 R |

FOREIGN PATENT DOCUMENTS 0197196 12/1985 European Pat. Off. .

OTHER PUBLICATIONS

Tsuchiya, Advances in Streak Camera Instrumentation for the Study of Biological and Physical Processes, IEEE Journal of Quantum Electronics, vol. QE-20, No. 12, Dec. 1984, pp. 1515-1528.
Valdmanis et al., Picosecond Electro-optic Sampling System, Appl. Phys. Lett., vol. 41, No. 3, Aug. 1, 1982, pp. 211-212.
Valdmanis et al., Subpicosecond Electrooptic Sampling: Principles and Applications, IEEE Journal of Quantum Electronics, vol. QE-33, No. 1, Jan. 1986, pp. 69-78.
Valdmanis et al., Electro-Optic Sampling: Testing Picosecond Electronics Part 1, Principles and Embodiments, Laser Focus/Electro-Optics, Feb. 1986, pp. 84, 86, 88, 90, 92, 94, 96.
Valdmanis et al., Electro-Optic Sampling: Testing Picosecond Electronics Part 2, Applications, Laser Focus/Electro-Optics, Mar. 1986, pp. 96-98, 100, 102, 104, 106.
Williamson et al., Picosecond Electro-Electron Optic Oscilloscope, Picosecond Electron, Optoelectron., 1985, pp. 58, 59, 61.
Valdmanis et al., Subpicosecond Electrical Sampling and Applications, Picosecond Optoelectronics Devices, Chapter 8, 1984, pp. 249-270.
Nees et al., Noncontact Electro-Optic Sampling with a GaAs Injection Laser, Electronics Letters, vol. 22, No. 17, Aug. 14, 1986, pp. 918-919.
Valdmanis et al., Subpicosecond Electrical Sampling, IEEE Journal of Quantum Electronics, vol. QE-19, No. 4, Apr. 1983, pp. 664-667.
Kolner et al., Electro-Optic Sampling with Picosecond Resolution, Electronics Letters, vol. 19, No. 15, Jul. 21, 1983, pp. 574-575.
Valdmanis, High-Speed Optical Electronics: The Picosecond Optical Oscilloscope, Solid State Technology, Test & Measurement World, Nov. 1986, pp. S40, S42, S44.
Kolner, Electrooptic Sampling in GaAs Integrated Circuits, IEEE Journal of Quantum Electronics, vol. QE-22, No. 1, Jan. 1986, pp. 79-93.

*Primary Examiner*—Ernest F. Karlsen
*Attorney, Agent, or Firm*—Finnegan, Henderson, Farabow, Garrett and Dunner

[57] ABSTRACT

A voltage detecting device for detecting voltages in an object under test including an electro-optic material covering a plurality of parts of the object under test; the refractive index of the electro-optic material being variable according to an applied voltage. A light source emits light through the electro-optic material toward the object under test and a detecting device receives an emergent light beam reflected from within the electro-optic material in order to detect voltages in the object. Further, a scanning device automatically scans the object under test with the light beam in order to detect voltages at a plurality of locations on the object.

5 Claims, 9 Drawing Sheets

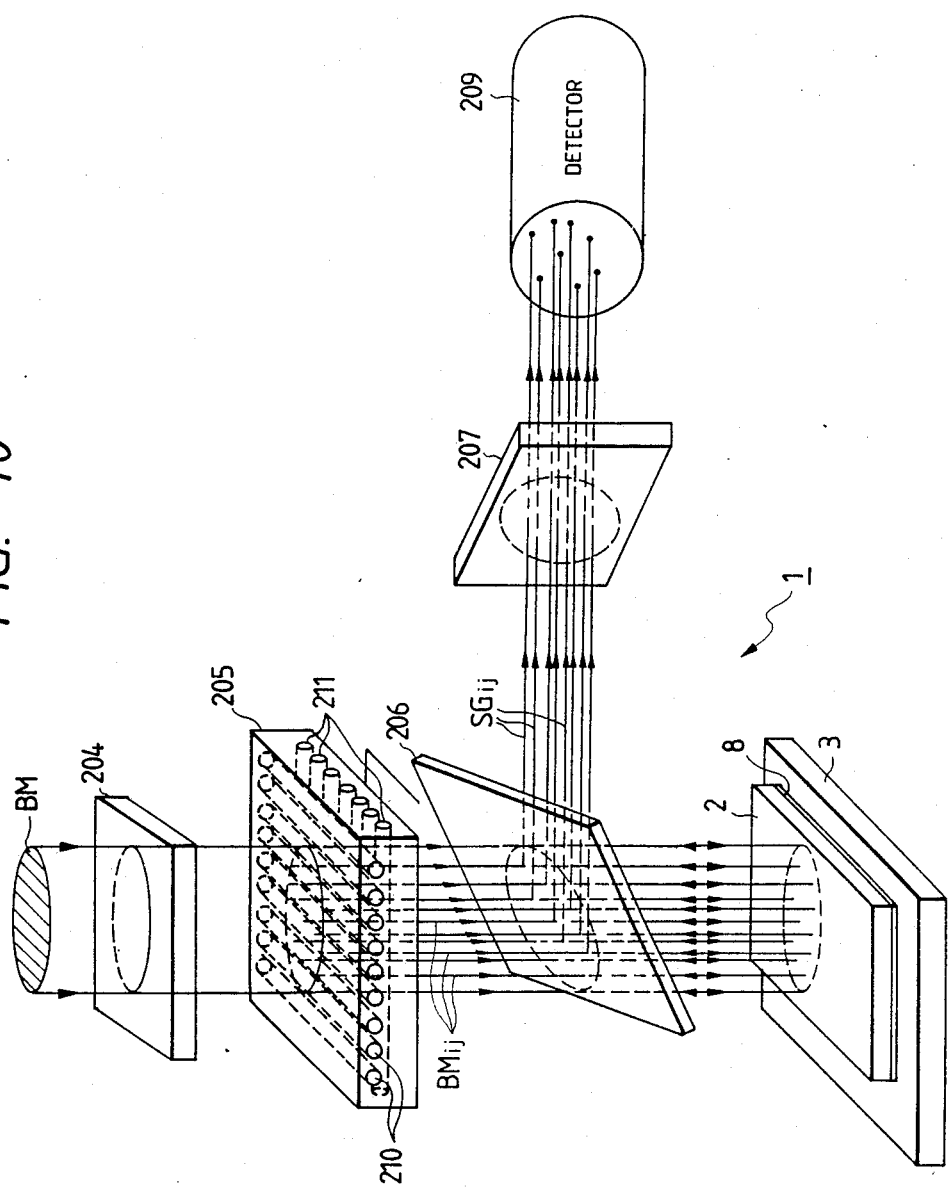

VOLTAGE MAPPING DEVICE HAVING FAST TIME RESOLUTION

BACKGROUND OF THE INVENTION 1. (Field of the Invention)

This invention relates to a voltage detecting device for detecting a voltage developed at a predetermined part of an object under measurement such as an integrated circuit, and more particularly to a voltage detecting device that utilizes the principle that the polarization of a light beam is changed by a voltage developed at a predetermined part of an object under test.

2. (Prior Art)

A variety of voltage detecting devices have been employed for detecting a voltage developed at a predetermined part of an object under measurement such as an integrated circuit. One example of a voltage detecting device of this type, which has been developed recently, detects the voltage of an object under test by utilizing the principle that the polarization of a light beam is changed by a voltage provided at a predetermined part of an object under measurement. A voltage detecting device of this type is disclosed in Japanese Unexamined patent application No. 137317/87 filed on May 30, 1987.

An optical probe having an extremely small sectional area includes an electro-optic material that has a refractive index that is affected by the voltage of an object under test. A light beam with a predetermined polarization component is applied to the electro-optic material, and variations in polarization of the light beam caused by the change in refractive index of the electro-optic material is detected for measurement of a voltage developed at one part of the object under test. Such a device is shown in FIG. 1.

The voltage detecting device 50, as shown in FIG. 1, comprises an optical probe 52, a light source 53 for example, a laser diode, an optical fiber 51 for leading the output light beam of the light source 53 through a condenser lens 60 to the optical probe 52, and a detector 55 to which a reference light beam REF and an emergent light beam SG from the optical probe 52 are applied.

The optical probe 52 is formed from an electro-optic material 62 of an optically uniaxial crystal such as lithium tantalate (LiTaO$_3$), and has an end portion 63 tapered like a truncated cone. A conductive electrode 64 is formed on the outer cylindrical wall of the optical probe 52. A reflecting mirror 65 of dielectric multilayer film or metal film is bonded to the top of the end portion 63.

The optical probe 52 further includes a collimator 94, condenser lenses 95 and 96, a polarizer 54 for extracting a light beam having a predetermined polarization component out of the output light beams of the collimator 94, and a beam splitter 56 that divides the output light beam of the polarizer 54 into the reference light beam REF and an incident light beam IN and applies an emergent light beam from the electro-optic material 62 to an analyzer 57. The reference light beam REF and the output light beam SG are applied through the condenser lenses 95 and 96 and the optical fibers 58 and 59, respectively, to the detector 55.

In operation, the conductive electrode 64 of the optical probe 52 is held at ground potential. Under this condition, the end portion 63 of the optical probe 52 is placed near an object under test, for instance an integrated circuit (not shown). As a result, the refractive index of the end portion 63 of the electro-optic material 62 in the optical probe 52 is changed. More specifically, in the optically uniaxial crystal, the difference between the refractive index of an ordinary light beam and that of an extraordinary light beam in a plane perpendicular to the light-traveling direction is changed.

The output light beam of the light source 53 is applied through the condenser lens 60 and the optical fiber 51 to the collimator 94. The output light beam of the collimator 94 is applied to the polarizer 54, where it is converted into a light beam having a predetermined polarization component and an intensity of I. The output light beam of the polarizer 54 is applied through the beam splitter 56 to the electro-optic material 62 in the optical probe 52. Each of the reference light and the input light provided by the beam splitter 56 has an intensity of I/2.

As described above, the refractive index of the end portion 63 of the electro-optic material 62 is affected by the voltage of the object. Therefore, the incident light beam IN applied to the electro-optic material 62 is changed in polarization with the refractive index of the end portion 63 of the electro-optic material 62, and reflected by the reflecting mirror 65. The reflected light beam is allowed to advance, as an emergent light beam, to the beam splitter 56. The polarization of the incident light beam IN changes in proportion to the difference in refractive index between the ordinary light beam and the extraordinary light beam (a light beam passing through electro-optic material wherein the polarization has been changed due to the voltage of the test object) which is caused by the voltage of the test object and a value 2l (where l is the length of the end portion 63 of the electro-optic material 62).

The emergent light beam is applied to the analyzer 57 by the beam splitter 56. The intensity of the emergent light beam applied to the analyzer 57 is reduced to I/4 by the beam splitter 56. In the case where the analyzer 57 is designed to transmit only a light beam having a polarization component perpendicular to the polarization component of the polarizer 54, the intensity I/4 of the emergent light beam applied to the analyzer 57 is converted into $(I/4) \sin^2[(\pi/2) \cdot V/V_0]$ (where V is the voltage of the object under test, and $V_0$ is the half-wave voltage by the analyzer.

The intensity $(I/4) \cdot \sin^2[(\pi/2)V/V_0]$ of the emergent light beam SG changes with the refractive index of the end portion 63 of the electro-optic material 62 which changes with the voltage of the object. Therefore, the detector 55 can detect the voltage provided at the predetermined part of the test object, such as an integrated circuit.

As described above, with the voltage detecting device 50 shown in FIG. 1, a voltage provided at a predetermined part of an object under test is detected from the change in refractive index of the end portion 63 of the electro-optic material 62 caused by placing the end portion 63 near the predetermined part of the object. Therefore, in the case where it is difficult to bring the optical probe into contact with a small part of an object under test, such as an integrated circuit, or where touching the test object with the optical probe may adversely affect the detection of the voltage, the voltage can be positively detected with the optical probe set apart from the object.

If a pulse light source such as a laser diode outputting a pulse light beam having an extremely small pulse width is employed as the light source 53 to detect high-speed voltage changes in the object under test when sampled at extremely short time intervals, or if a CW (Continuous-Wave) light source is employed as the light source 53 while a high-speed response detector such as a streak camera is used as the detector 55 so that high-speed voltage changes of the object may be measured with high time resolution, then high-speed voltage changes can be detected with high accuracy.

In the voltage detecting device 50 shown in FIG. 1, the optical probe 52 is extremely small in cross section, and the device 50 is provided for measurement of a voltage provided at only one point (position) of an object. Accordingly, when it is required to measure voltages at a plurality of points of an object, the operator must manually move the optical probe 52 to each of the points on the object. This manual movement of the optical probe is rather troublesome and time consuming.

Thus, the conventional voltage detecting device cannot be used to detect the voltages at a plurality of locations or parts of an object under test simultaneously. Also, it is physically difficult to miniaturize the optical probe, and it is difficult to improve the spatial resolution and thereby improve voltage measurement accuracy.

SUMMARY OF THE INVENTION

An object of the present invention is a voltage detecting device that can readily detect voltages at a plurality of points of an object under test.

Another object of the present invention is a voltage detecting device having improved spatial resolution to enable the detection of voltages in an object under test with high accuracy.

A further object of the present invention is a voltage detecting device that can simultaneously detect voltages at a plurality of two-dimensional parts of an object under test.

In order to achieve the foregoing and other objects, the voltage detecting device of the present invention comprises: an electro-optic material adapted to be disposed to cover a plurality of parts of the object under test, said electro-optic material having a refractive index that varies according to a voltage applied thereto; a light source for emitting a light beam through said electro-optic material toward the object under test; detecting means for receiving an emergent light beam reflected from within said electro-optic material for detecting voltages in the object under test; and scanning means for scanning said light beam emitted by said light source over a plurality of points on said electro-optic material so as to detect voltages at the plurality of parts of the object under test.

BRIEF DESCRIPTION OF THE DRAWINGS

The manner by which the above objects and other objects, features, and advantages of the present invention are attained will be fully apparent from the following detailed description when considered in view of the drawings, wherein:

FIG. 10 is an illustration of still further embodiment of a voltage detecting device according to the present invention;

DETAILED DESCRIPTION OF THE INVENTION

Figure 1:
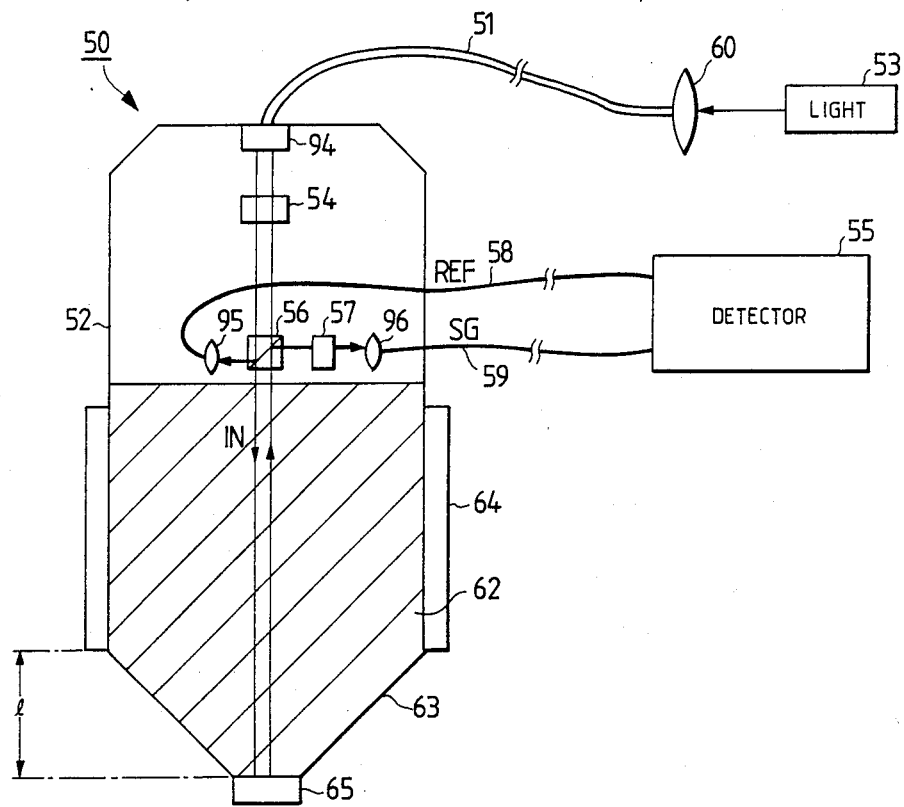
FIG. 1 is an illustration of a voltage detecting device over which the present invention is an improvement.

In a voltage detecting device provided according to the present invention, an electro-optic material may be placed to cover a plurality of parts or locations of an object under measurement to detect the voltages at those parts or locations. A light beam emitted from a light source is uniformly applied as parallel rays of light to parts or locations of the electro-optic material which correspond in position to the plurality of two-dimensional parts or locations of the object, and variations in the polarization of emergent rays of light from the two-dimensional parts of the electro-optic material are detected with a detector.

A voltage detecting device provided according to another aspect of the present invention comprises an observing light source for outputing a light beam different in wavelength from the above-described light source (pulse light source) for use in observing a wiring pattern of the object under test. Switching means apply one of the light beams outputted by the observing light source and the pulse light source to the electro-optic material and when the wiring pattern of the object is observed, phase compensating means adjusts the phase of the emergent rays of light so as to be different from that which is provided when the variations in polarization of the emergent rays of light are detected. A display means displays the voltages of the two-dimensional parts of the object which are measured from the variations in polarization of the emergent rays of light, in superposition with the wiring pattern of the object that is observed with the detector, and variable delay means shift the timing of application of the light beam from the pulse light source to the electro-optic material, for the purpose of measuring, in a sampling mode, the variation of the voltages provided at the two-dimensional parts of the object.

In the voltage detecting device of the present invention, the electro-optic material is first positioned to cover a plurality of parts of an object under test, the voltages of which should be detected, and the electro-optic material is scanned with a light beam in such a manner that the light beam is applied to the parts of the electro-optic material which correspond in position to the plurality of parts of the object. The electro-optic material scanning operation may be achieved by deflecting the light beam with movable mirrors or acousto-optical reflectors, or by moving the electro-optic material and the object. The voltages of the plurality of parts of the object can be readily detected from the variations in polarization of emergent light beams from the parts of the electro-optic material. Furthermore, the light beam can be applied to the electro-optic material while being focused thereon. Therefore, the device of the invention provides high spatial resolution, and can detect voltages with high accuracy.

The output light beam of the light source may also be applied by means of a micro-lens array, holographic lens, or spatial light modulator, as incident rays of light arranged in a desired pattern, to the parts of the electro-optic material which correspond in position to the predetermined parts of the object. In this operation, the refractive indexes of the parts of the electro-optic material have been changed by the voltages provided at the corresponding parts of the object. Therefore, the incident rays of light applied to the parts of the electro-optic material are changed in polarization by the variations in refractive index of the parts of the electro-optic material, and are outputted, as emergent rays of light, from the electro-optic material. These emergent rays of light are applied to the detector, such as a two-dimensional photodetector or streak camera, and the voltages provided at the predetermined parts, such as two-dimensional parts, of the object can be simultaneously detected with the detector.

As a further aspect of the voltage detecting device provided according to the present invention, voltages provided at two-dimensional parts of the object under test are displayed in superposition with the wiring pattern of the object. For this purpose, in order to observe the wiring pattern of the object, a switching means is operated so that the output light beam of the observing light source is applied to the electro-optic material, and the phase of the emergent rays of light is adjusted for observation by the phase compensating means. As a result, the light beam from the observing light source is applied, as parallel rays of light, to the electro-optic material. The parallel rays of light reach the surface of the object through the electro-optic material. A dielectric multi-layer film mirror, which reflects the output light beam of the pulse light source more strongly than the output light beam of the observing light source, is formed on the bottom surface of the electro-optic material. Some of the parallel rays of light applied to the surface of the object are reflected by the wiring pattern of the object and outputted, as emergent rays of light, from the electro-optic material. The emergent rays of light from the electro-optic material are applied through the phase compensating means to the two-dimensional detector, where they are detected as visible image data of the wiring pattern of the object.

After the visible image data of the wiring pattern of the object has been detected in this manner, in order to detect the voltages of the two-dimensional parts of the object, the switching means is operated so that the output light beam of the pulse light source is applied to the electro-optic material, and the phase of the emergent rays of light is adjusted for voltage detection by the phase compensating means. In this case, the operation of the object must be in synchronization with the pulse light beam. As a result, the voltages of the two-dimensional parts of the object at one sampling time instant are detected. Thereafter, the display means displays on a display unit, or the like, the wiring pattern of the object detected by the detector, and further displays the voltages of the object measured at the one sampling time instant in superposition with the wiring pattern of the object thus displayed. Then, the output light beam of the pulse light source is briefly delayed by the variable delay means, so that the voltages of the two-dimensional parts of the object are detected at the time instant that occurs somewhat after the preceding sampling time instant, and are displayed by the display means. Thus, the variations of the voltages at the two-dimensional parts of the object can be observed on the display screen in such a manner that they are superimposed on the wiring pattern of the object.

Figure 2:
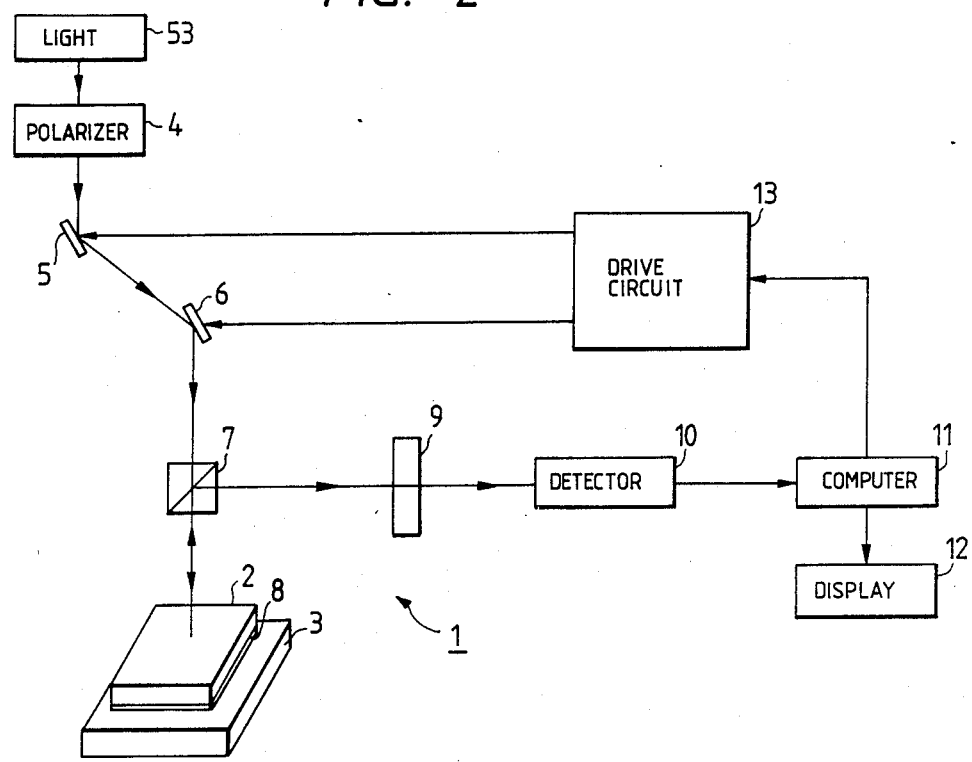
FIG. 2 is an illustration of an embodiment of a voltage detecting device according to the present invention.

In the voltage detecting device 1, as shown in FIG. 2, an electro-optic material 2 is held near or in contact with an object 3 under test, e.g., an integrated circuit. The electro-optic material 2 is shaped like a plate or a prism, and its section is much larger than the section of the electro-optic material 62 in the optical probe 52 of the voltage detector 50 shown in FIG. 1. Thus, the material 2 is large enough to cover plurality of measurement points on the object 3. A reflecting mirror 8 of a metal or dielectric multi-layer film is formed on the bottom surface of the electro-optic material 2. In the case where the reflecting mirror 8 is a metal film, the measurement should be carried out with the reflecting mirror spaced away from the object 3 or with an insulating material (not shown) interposed between the reflecting mirror and the object 3.

The voltage detecting device 1 includes a light source 53, a polarizer 4 for extracting a light beam having a predetermined polarization component from the output light of the light source 53, two movable mirrors 5 and 6 for guiding the extracted, polarized light beam, and a beam splitter 7 for applying the light beam to the electro-optic material 2, as an incident light beam, and for splitting an emergent light beam from the electro-optic material 2. The device also includes an analyzer 9 for extracting a light beam having predetermined polarization component from the emergent light beam which has been reflected by the beam splitter 7 and changed in polarization, and a detector 10 to which an emergent light beam from the analyzer 9 is applied.

In the case where the light source 53 is a pulse light source, a photo-electric conversion element is utilized as the detector 10 to sample the intensity of the emergent light beam from the electro-optic material 2 to detect the voltage of the object under test. In the case where a CW light source is used as the light source 53, a high-speed response detector such as a streak camera for observing the intensity of the emergent light beam as a streak image is employed as the detector 10.

The output of the detector 10 is applied to a computer 11, where it is processed as required. The output of the computer 11 is stored in a memory (not shown), and is then displayed on a display unit 12 at the end of the voltage detecting operation.

Figure 3:
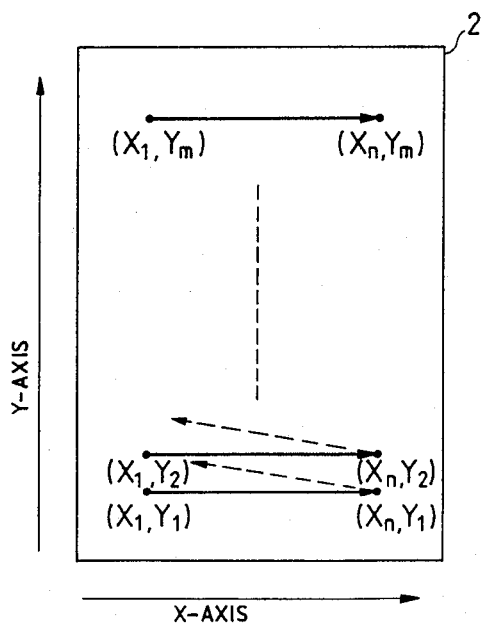
FIG. 3 is an explanatory diagram of an electro-optic material scanning method performed by the voltage detecting device of the present invention.

In the above-described voltage detecting device, the electro-optic material 2 is large enough to cover a plurality of measurement points (positions) on the object 3. In order to sequentially detect voltages provided at the plurality of measurement points on the object 3, the incident light beam is allowed to scan the electro-optic material 2 in the direction of the X-axis and in the direction of the Y-axis as shown in FIG. 3 while being focused on the object.

The movable mirror 5 is provided to scan the electro-optic material 2 in the direction of the X-axis, and the movable mirror 6 is provided to scan the electro-optic material 2 in the direction of the Y-axis. More specifically, when it is determined by the computer 11 that a voltage at a measurement point on the object 3 has been detected, the movable mirrors 5 and 6 are driven by a drive circuit 13 under control of the computer 11 so that the incident light beam scans the electro-optic material in the direction of the X-axis and in the direction of the Y-axis.

It is assumed that first the movable mirrors 5 and 6 are so positioned that the incident light beam is applied to a point $(x_1, y_1)$ on the electro-optic material as shown in FIG. 2. The refractive index of the part of the electro-optic material 2 which corresponds to the point $(x_1, y_1)$ is changed by the voltage of the object which is developed just below the point $(x_1, y_1)$. Therefore, the incident light beam applied to the point $(x_1, y_1)$ is changed in polarization in accordance with the change in refractive index, and is then reflected by the reflecting mirror 8 so that it is applied, as an emergent light from the electro-optic material 2, to the beam splitter 7. The light beam is further applied through the analyzer 9 to the detector 10. The detector 10 detects a voltage provided at the part of the object 3 which is located just below the point $(x_1, y_1)$ on the electro-optic material 2, and sends the voltage value to the computer 11. In the computer 11, the voltage value is processed and stored in a memory (not shown).

In order to detect a voltage provided at the part of the object 3 which is located just below the next scanning point on the electro-optic material 2, the computer 11 controls the drive circuit 13 to change the position of the movable mirror 5. As a result, the movable mirror 5 is moved in the direction of the X-axis so that the incident light beam is applied to the next scanning point on the electro-optic material 2, and the voltage detection operation is carried out in the same manner.

The movable mirror 5 is further repositioned in the direction of the X-axis until the incident light beam is applied to a point $(x_n, y_1)$ on the electro-optic material 2. When a voltage developed at the part of the object 3 which is located just below the point $(x_n, y_1)$ is detected, the computer 11 controls the drive circuit 13 to change the positions of movable mirrors 5 and 6 so that the electro-optic material 2 is scanned in the direction of the X-axis at a position $y_2$ on the Y-axis. As a result, the movable mirror 6 is positioned to hold the incident light beam at the position $y_2$ and the movable mirror 5 is moved to scan the incident light beam at positions $x_1$ through $x_n$ successively. The voltage detection operation is carried out in the same manner for the positions $(x_1, y_2)$ through $(x_n, y_2)$.

The mirror 6 is eventually moved to hold the incident light beam at a position $y_m$ on the Y-axis, and the mirror 5 scans the incident light beam through positions $x_1$ through $x_n$, successively, so that voltages developed at the parts of the object which are located just below the points $(x_1, y_m)$ through $(x_n, y_m)$ on the electro-optic material 2 are detected. Thus, the voltages at a plurality of parts of the object can be detected. At the end of the voltage detection, the detected voltage levels are stored in the memory of the computer 11 to be later displayed on the display unit 12.

As is apparent form the above description, in the first example of the voltage detecting device of the invention, the electro-optic material 2 is fixedly held as it is scanned with the light beam so that the voltages developed at a number of parts of the object are detected.

Figure 4:
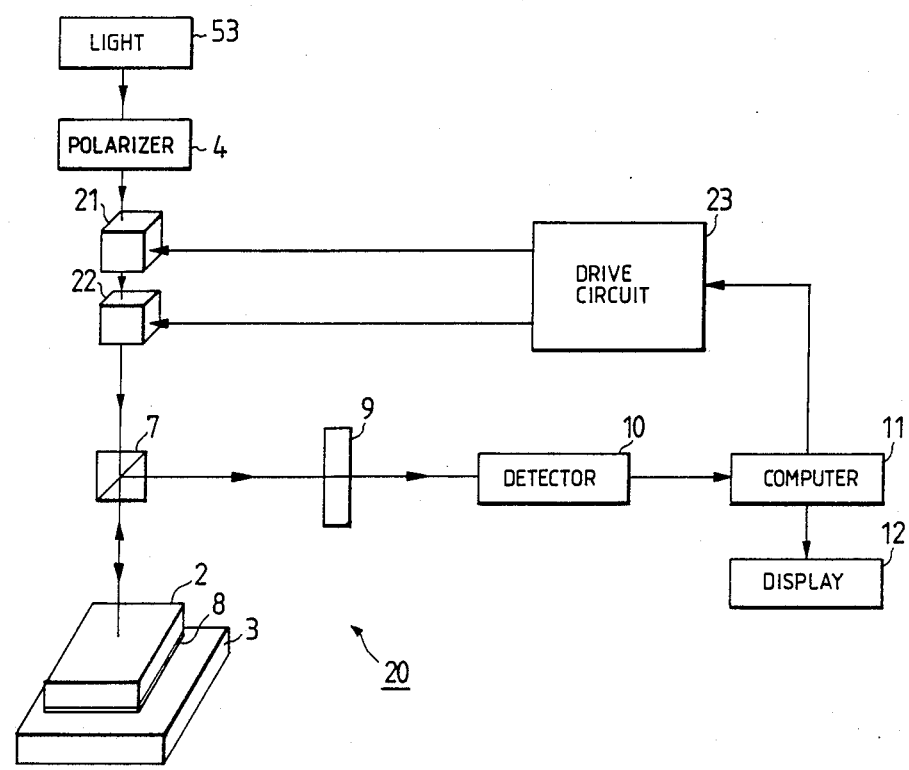
FIG. 4 is an illustration of a modification of the voltage-detecting device of the present invention.

FIG. 4 shows a modification of the voltage detecting device 1 shown in FIG. 2. In the voltage detecting device 20 shown in FIG. 4, as in the voltage detecting device 1 of FIG. 2, the electro-optic material 2 is stationary; however, it should be noted that the device 20 is different from the device 1 in that the device 20 employs acousto-optical deflectors 21 and 22 instead of the movable mirrors 5 and 6 (FIG. 2). The acousto-optical deflectors 21 and 22 are driven by a drive circuit 23, which is controlled by a computer 11, to deflect the light beam in the direction of the X-axis and in the direction of the Y-axis, respectively.

As in the voltage detecting device 1 shown in FIG. 2, the light beam is caused to scan the electro-optic material 2 in the direction of the X-axis and in the direction of the Y-axis while being focused thereon, so that voltages provided at a number of parts of the object 3 under test are detected.

Figure 5:
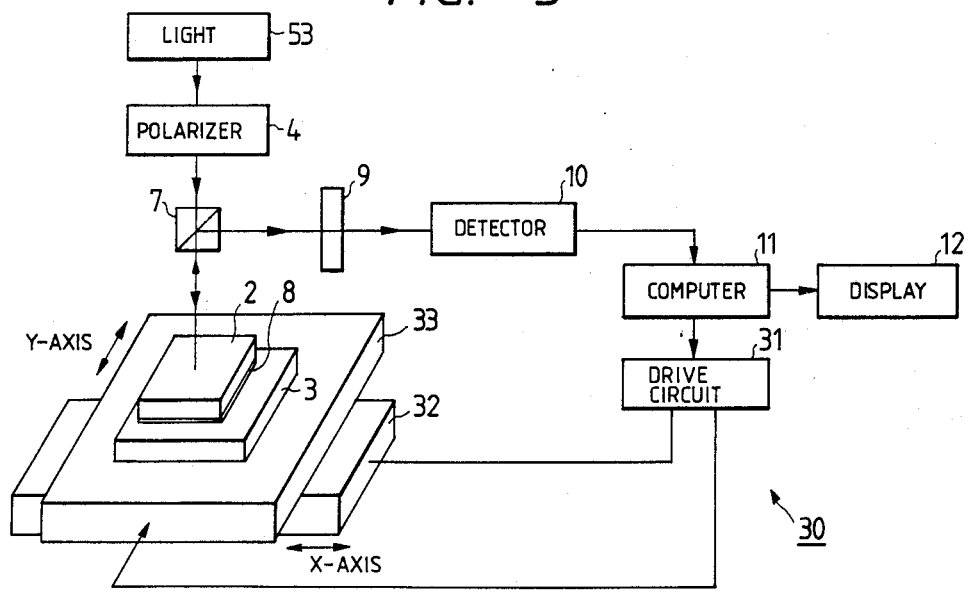
FIG. 5 is an illustration of another embodiment of a voltage detecting device according to the present invention.

FIG. 5 is an explanatory diagram showing the arrangement of a second example of the voltage detecting device according to the present invention. In FIG. 5, those components which have been previously described with reference to FIG. 2 or 4 are similarly numbered. In the voltage detecting device of FIG. 5, the output light beam of the light source 53 is not deflected; instead, the electro-optic material 2 and the object 3 under test are moved in the direction of the X-axis and in the direction of the Y-axis so that the electro-optic material 2 is scanned with the light beam. That is, the voltage detecting device of FIG. 5 employs none of the movable mirrors 5 and 6 or the acousto-optical deflectors 21 and 22. Instead, the drive circuit 31, which is controlled by the computer 11, drives motor tables 32 and 33 which move the object 3 under test respectively in the direction of the X-axis and in the direction of the Y-axis.

In the voltage detecting device 30, the electro-optic material 2 and the object 3 are moved in the direction of the X-axis and in the direction of the Y-axis, so that voltages developed at a number of parts of the object 3 are detected successively. In the above-described voltage detecting device 30, both the electro-optic material and the object 3 are moved; however, the same effect can be obtained by moving only the object 3.

As described above, in the first or second embodiment of the voltage detecting device of the invention, the light beam is applied to the electro-optic material while being focused thereon, and the light beam is deflected by means of the movable mirrors 5 and 6 or the acousto-optical deflectors 21 and 22, or the electro-optic material 2 and the object 3 are moved without deflection of the light beam, so that the electro-optic material 2 is scanned with the light beam to detect the voltages at a plurality of parts of the object 3.

In the above-described voltage detecting devices, the electro-optic material is scanned, in its entirety, in the direction of the X-axis and in the direction of the Y-axis.

However, in the case where the parts of an object 3 to be scanned to determine the voltages are predetermined, the following method may be employed: The positions of the parts of the object 3 are stored in memory in the computer 11 in advance, and the light beam is applied to the parts of the electro-optic material 2 which correspond to the stored parts of the object 3.

The voltages provided at a plurality of parts of the object can also be detected with higher accuracy by using the following method. The light beam from the light source 53, after being reflected from the beam splitter 7, is received, as a reference light beam, by a photodetector and converted into a voltage. The voltage is stored in the computer 11 and compared with a signal provided by an emergent light beam from the electro-optic material to correct for fluctuations in intensity of the light source 53.

Figure 6:
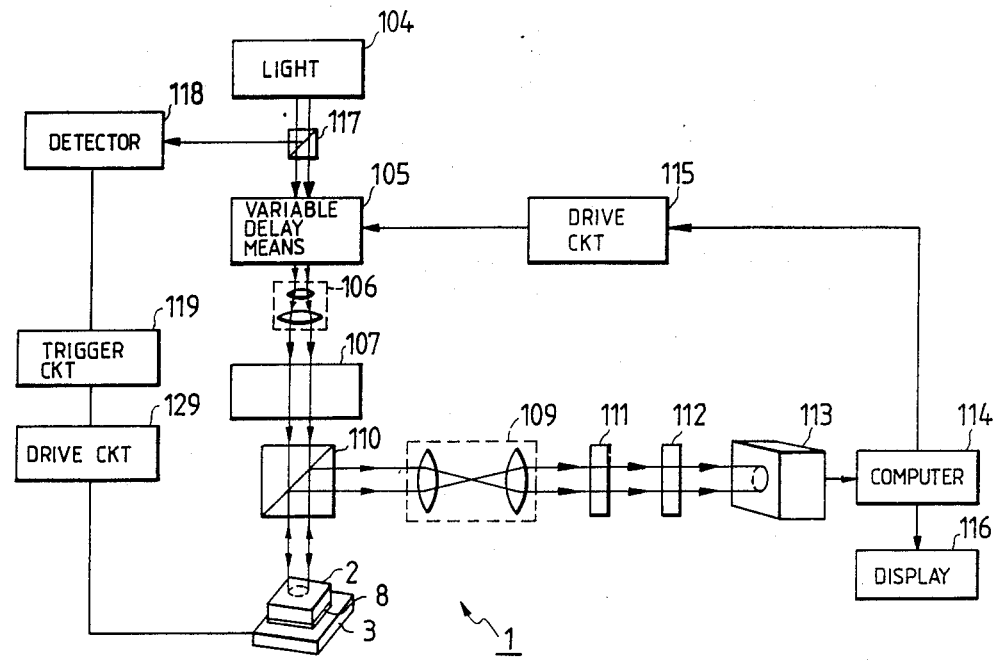
FIG. 6 is an illustration of further embodiment of a voltage detecting device according to the present invention which employs a pulse light source and a two-dimensional detector.

FIG. 6 is an explanatory diagram showing the arrangement of another embodiment of the voltage detecting device according to the present invention.

As described above, the voltage detecting device 1 includes electro,-optic material 2 held close to or in contact with an object 3 under measurement. The electro-optic material 2 is large enough to cover a plurality of two-dimensional parts (or points) of the object 3. A reflecting mirror 8 made of a metal or a dielectric multilayer film is formed on the bottom surface of the electro-optic material 2.

The voltage detecting device 1 further comprises a pulse light source 104 for emitting a light beam with an extremely short pulse width, variable delay means 105 for variably delaying the output light beam of the pulse light source 104, an enlarging optical system 106 for two-dimensionally enlarging the light beam delayed by the variable delay means into parallel rays of light, and a polarizer 107 for extracting a predetermined polarization component from the parallel light beams. A beam splitter 110 applies the parallel rays of light to the electro-optic material 2 and applies a part of the light beam to an image-forming optical system 109 for voltage detection. Light reflected from the reflecting mirror 8 formed on the bottom surface of the electro-optic material 2 passes through the image forming optical system 109 to a phase compensator 111 for adjusting the phase of an emergent light beam from the image forming optical system 109. An analyzer 112 transmits only a light beam having a predetermined polarization component, which is selected out of the emergent light beam that has been phase-adjusted by the phase compensator 111. A detector 113 receives the emergent light beam from the analyzer 112.

As described above, the parallel rays of light applied to the electro-optic material 2 are two-dimensionally spread by means of the enlarging optical system 106. That is, they are applied to the electro-optic material 2 with uniform distribution, and the electro-optic material 2 is large enough to cover a plurality of two dimensional parts of the object 3. The parallel rays of light applied to the electro-optic material 2 with uniform distribution are changed in polarization with changed in the refractive indexes of the two-dimensional parts of the electro-optic. material 2, which correspond in position to the two-dimensional parts of the object 3. The reflected parallel rays of light emerge as rays of light (hereinafter referred to as "an emergent light beam", when applicable) from the electro-optic material 2. That is, the emergent rays of light from the electro-optic material 2 are equal in the area of distribution to the incident parallel rays of light (hereinafter referred to as "a parallel light beam", when applicable), and the changes in polarization of the parts of the electro-optic material 2 represent the voltages of the two-dimensional parts of the object 3, respectively.

The phase compensator 111 adjusts the phase of the emergent light beams to allow the polarization component of the emergent light beam extracted by the analyzer 112 to form a predetermined angle with the polarization component of the parallel light beam extracted by the polarizer 107. For instance, the phase compensator 111 can make the polarization component of the emergent light beam extracted by the analyzer 112 parallel to or perpendicular to that of the parallel light beam extracted by the polarizer 107.

The detector 113 is a two-dimensional detector such as a CCD camera, photo-diode array or vidicon camera. The detector 113 detects the intensity of an emergent light beam from the analyzer 112 so that voltages provided at two-dimensional parts of an object 3 under test are simultaneously detected from the changes in refractive index of the corresponding parts of the electro-optic material 2.

In the case where the pulse light source 104 and the two-dimensional detector 113 are used in combination, voltages at two-dimensional parts of an object 3 under test must change periodically in synchronization with the light pulse. The light beam emitted from the pulse light source 104 is split by the beam splitter 117 into two parts: one of the two parts is applied to the variable delay circuit 105 for the purpose of sampling measurement, whereas the other is applied to a detector 118 where it is subjected to photo-electric conversion.

The output signal of the detector 118 is applied through a trigger circuit 119 to a drive circuit 129 so that the object 3 under test is operated periodically in synchronization with the light pulse. That is, voltages, which change repeatedly, are detected by sampling. This sampling operation is carried out by gradually delaying the output light beam of the pulse light source 104 with the variable delay means 105 that is controlled by a computer 114. The voltages at the two-dimensional parts of the object 3 are detected by the detector 113 with predetermined timing, and are then processed by the computer 114. The values of the voltages thus processed are stored in a memory (not shown). At the same time, the computer 114 controls the drive circuit 115 to drive the variable delay means 105 to delay the light beam from the pulse light source 104, whereby the sampling timing is somewhat shifted. Thus, the variations of the voltages at the two-dimensional parts of the object 3 under test can be detected.

In the voltage detecting device 1 thus organized, first the phase compensator 111 is adjusted so that the polarization component of the emergent rays of light extracted by the analyzer 112 is perpendicular to the polarization component of the parallel rays of light extracted by the polarizer 107. Therefore, when the emergent rays of light from the electro-optic material 2 are the same in polarization as the parallel rays of light applied to the electro-optic material 2 (when no voltage is applied to the electro-optic material 2), no emergent rays of light will pass through the analyzer 112. After the phase compensator 111 has been adjusted in this manner, voltages at the two-dimensional parts of the object are detected.

As described above, the electro-optic material 2 is large enough to cover the two-dimensional parts of the object 3 under test. Therefore, the refractive indexes of the local parts of the electro-optic material 2 which correspond in position to the two-dimensional parts of the object 3, are changed by the voltages provided at the two-dimensional parts of the object 3. Accordingly, the parallel rays of light applied uniformly to the electro-optic material 2 are changed in polarization by the variations in refractive index of the two-dimensional parts of the electro-optic material 2 which correspond to the two-dimensional parts of the object 3 under test, and are outputted as emergent rays of light from the electro-optic material 2.

The emergent rays of light are applied through the beam splitter 110 and the image-forming optical-system 109 to the phase compensator 111, where they are subjected to phase adjustment. The emergent rays of light thus processed are applied to the analyzer 112. The phase compensator 111 is adjusted so that the analyzer 112 transmits only the light beam whose polarization component is perpendicular to the polarization component of the polarizer 107. Therefore, the emergent rays of light applied to the analyzer 112 are made proportional in intensity to $\sin^2[(\pi/2)\cdot V_{ij}/V_0]$ by the analyzer 112, and are then applied to the detector 113. In the expression, $V_{ij}$ is the voltage developed in the two-dimensional position of a part of the object 3 under test, and $V_0$ is the half-wave voltage provided at the part.

As is apparent from the above description, the emergent rays of light are affected by the variations in refractive index of the two-dimensional parts of the electro-optic material 2 which are caused by the variations in voltage of the corresponding two-dimensional parts of the object 3 under test. Accordingly, voltages provided at two-dimensional parts of an object 3 under test can be simultaneously detected by the detector 113.

When the voltages of the two-dimensional parts of the object 3 are detected by the detector 113, the results of detection are stored in memory in the computer 114. In order to detect voltages with the following timing, the computer 114 controls the drive circuit 115 to drive the variable delay means 105, as a result of which the output light beam of the pulse light source 104 is delayed as required. That is, the sampling timing is somewhat shifted and the voltage detecting operation is carried out in the same manner. The variations in voltage of the parts of the object 3 are measured in the sampling mode as described above. The results of measurement are stored in memory in the computer 114. When the measurement is carried out for a certain period of time, the computer 114 causes the display unit 116 to display the results of measurement. Thus, the voltage detecting operation of the device is accomplished.

In the voltage detecting device 1 of FIG. 6, the pulse light source 104 and the two-dimensional detector 113, such as a CCD camera, photo-diode array, or vidicon camera, are used in combination to detect the voltages by sampling which change periodically at two-dimensional parts of an object 3 under test. However, the voltage detecting device 1 cannot detect the voltage which does not change periodically.

Figure 7:
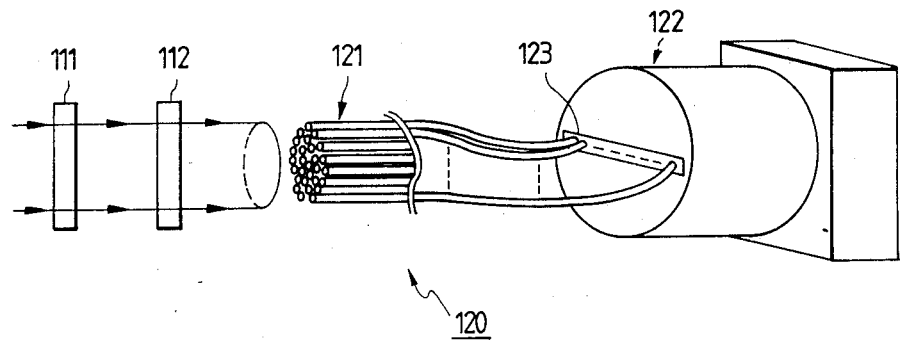
FIG. 7 is an illustration of a streak camera as used in the voltage detecting device of FIG. 6.

FIG. 7 is an explanatory diagram outlining the arrangement of a part of a voltage detecting device that uses a streak camera to detect voltages at two-dimensional parts of an object under test.

In the voltage detecting device 120 of FIG. 7, instead of the two-dimensional detector 113 (FIG. 6) a bundle of optical fibers 121 is provided for guiding the emergent rays of light which have been passed through the phase compensator 111 and the analyzer 112. A streak camera 122 receives the guided emergent rays of light from the bundle of optical fibers 121. The device 120 of FIG. 7, may include a light source (not shown) such as a pulse light source, or a CW light source.

As is apparent from FIG. 7, the bundle of optical fibers transfers the two-dimensional arrangement of the emergent rays of light into a one-dimensional arrangement as the emergent rays of light are applied to a linear slit 123 of the streak camera 122.

In the voltage detecting device 120, after the phase compensator 111 is adjusted, as in the case of the voltage detecting device 1 of FIG. 6, the parallel rays of light are applied to the electro-optic material 2 by the pulse light source or CW light source, and the rays of light that emerge from the electro-optic material 2 and are passed through the phase compensator 111 and the analyzer 112 are applied to the bundle of optical fibers 121. As described above, the bundle of optical fibers 121 is arranged one-dimensionally (or in a line) at the slit 123 of the streak camera 122. Therefore, the voltage data of the two-dimensional parts of the object 3, being arranged one-dimensionally, are detected with high time resolution by the streak camera 122. In the case where the voltage detecting device employs a streak camera, it is unnecessary to use the variable delay means 105, and even a single or non-repetitive change in voltage of the object can be detected.

In the above-described embodiments, only voltages provided at two-dimensional parts of an object under test are detected, and displayed on the display unit 116. On the other hand, it would be convenient for the operator if the wiring pattern of an object 3 under test (such as an integrated circuit) is detected, and voltages provided at two-dimensional parts of the object were displayed in combination with the wiring pattern detected.

Figure 8:
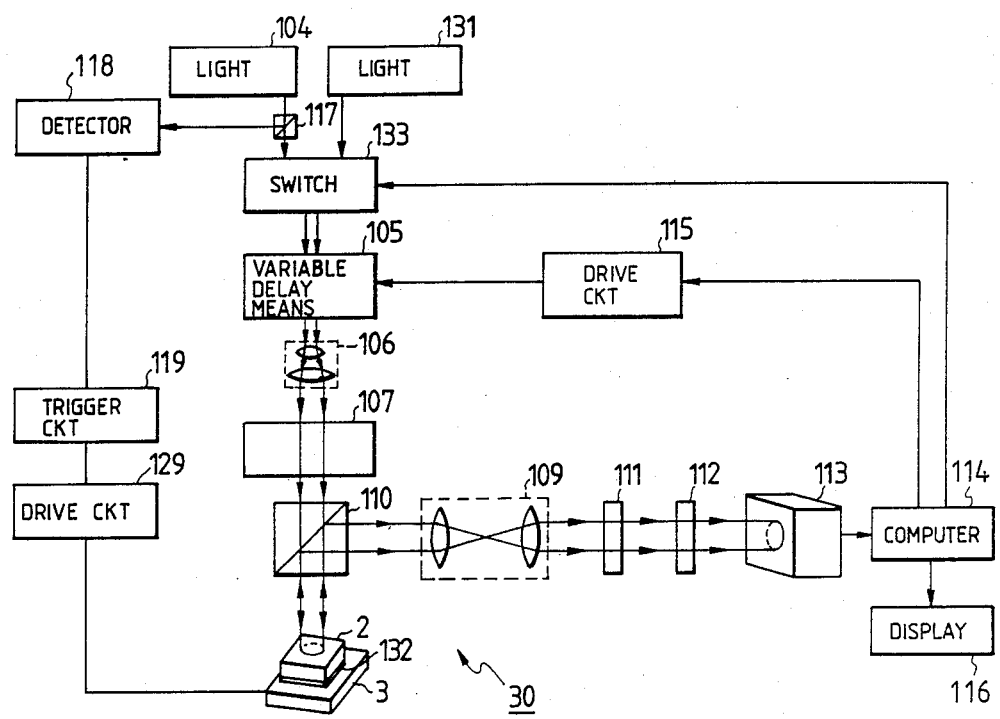
FIG. 8 is an illustration of a voltage-detecting device according to the present invention which displays the distribution of voltages provided at two-dimensional parts of an object under test in superposition with the wiring pattern of the object.

FIG. 8 is an explanatory diagram of a voltage detecting device that can display voltages at two-dimensional parts of an object in combination with the wiring thereof. In FIG. 8, parts corresponding functionally to those that have been already described with reference to FIG. 6 are designated by the same reference numerals.

In the voltage detecting device 30 of FIG. 8, in addition to the pulse light source 104, an observing light source 131 outputing a pulse light beam or CW light beam is provided to observe the wiring pattern of the object 3 under test. The light beam outputted by the observing light source 131 is different in wavelength from that outputted by the pulse light source; that is, the output light beam of the pulse light source 104 is reflected by a dielectric multi-layer film mirror 132 formed on the bottom surface of the electro-optic material 2. The output light beam of the observing light source 131 is transmitted through the dielectric multi-layer film mirror to the object 3.

A desired one of the light beams emitted from the light sources 104 and 131 is selected by switch 133 under control of the computer 114. In the observation of the wiring pattern of the object 3, the switch 133 selects the light beam outputted by the observing light source 131 so that it is applied through the electro-optic material 2 to the object 3 under test. In detection of voltages provided at two-dimensional parts (or points) of the object 3, the switch 133 selects the output light beam of the pulse light source 104 so that it is applied to the electro-optic material 2.

The phase compensator 111 is controlled by the computer 114. More specifically, in observing the wiring pattern of the object 3, the phase compensator 111 is adjusted so that the analyzer 112 transmits the emergent light beam having the same polarization component as that of the polarizer 107. In detection of voltages provided at two-dimensional parts of the object 3, the phase compensator 111 is adjusted so that the analyzer 112 transmits the emergent light beam whose polarization component is perpendicular to that of the polarizer 107.

With the voltage detecting device 30 thus organized, in order to observe the wiring pattern of the object 3 under test, the computer 114 controls the switch 133 to apply the output light beam of the observing light source 131, in the form of parallel rays of light, to the surface of the object 3 under test, and adjusts the phase compensator 111 so that the analyzer 112 transmits the emergent light beam having the same polarization component as that of the polarizer 107.

As a result, the output light beam of the observing light source 131 is applied through the variable delay means 105, the enlarging optical system 106, the polarizer 107 and the beam splitter 110, as parallel rays of light, to the electro-optic material 2, and through the dielectric multi-layer film mirror 132 to the surface of the object 3. Depending on the wiring pattern on the surface of the object 3 and the material of the latter, some of the parallel rays of light are reflected and applied through the dielectric multi-layer film mirror 132, the electro-optic material 2, the beam splitter 110, the image-forming optical system 109 and the phase compensator 111, as emergent rays of light, to the analyzer 112. As described above, the phase compensator 111 is adjusted so that the analyzer 112 transmits the emergent light beam having the same polarization component as that of the polarizer 107. Therefore, the emergent rays of light applied to the analyzer 112 pass through the analyzer 112 and are applied to the two-dimensional detector 113, such as a CCD camera. The emergent light beam applied to the detector 113 has the visible image data of the wiring pattern on the surface of the object 3. Therefore, the emergent light beam is subjected to photoelectric conversion in the detector 113, to provide the visible image data of the wiring pattern. The visible image data is stored in a memory (not shown) in the computer 114.

After the visible image data of the wiring pattern of the object 3 has been stored as described above, the computer 114 initializes the variable delay means 105 and controls the switch 133 so that the output light beam of the pulse light source 104 is applied, as parallel rays of light, to the electro-optic material 2. The computer 114 further controls the phase compensator 111 so that the analyzer 112 transmits emergent rays of light having a polarization component perpendicular to that of the polarizer 107. Under this condition, voltages provided at two-dimensional parts of the object 3 under test are detected simultaneously. In this operation, the output light beam of the pulse light source 104 is applied, as parallel rays of light, to the electro-optic material 2. The parallel rays of light are reflected by the dielectric multi-layer film mirror 132 and are changed in polarization with the variations in refractive index of the electro-optic material 2, thus being applied, as emergent rays of light, to the phase compensator 111 and the analyzer 112. Only the emergent rays of light having the predetermined polarization component pass through the analyzer 112 and are applied to the two-dimensional detector 113. In the detector 113, the voltages of the two-dimensional parts of the object 3 detected with the timing set by the variable delay means 105 are simultaneously detected by sampling. The results of voltage detection with one timing are supplied to the computer 114, where they are stored in the memory. Then, the results of detection of the voltages at the two-dimensional parts of the object 3 under test are displayed on the display unit 116 being superposed on the previously-stored visible image data of the wiring pattern of the object 3.

Figure 9A:
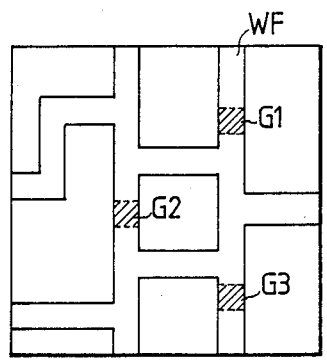
FIGS. 9(a) and 9(b) are explanatory diagrams showing the distributions of voltage detected at different sampling times as displayed by the voltage detecting device of FIG. 8.

FIG. 9(a) shows the results of the detection of voltages provided at two-dimensional parts of an object 3 at one sampling timing which are displayed on the display unit 116 in a manner superposed on the wiring pattern of the object 3. More specifically, in FIG. 9(a), a two-dimensional voltage distribution as indicated at G1, G2 and G3 is shown superposed on the wiring pattern WF of the object 3.

After the results of detection of the voltages made with one sampling timing are displayed in superposition on the wiring pattern, the computer 114 controls the drive circuit 115 to drive the variable delay means 105, so that the delay of the output light beam of the pulse light source 104 is changed, and the sampling timing is somewhat changed. Under this condition, the voltage detecting operation and the display of the results of detection of voltages are carried out in the same manner.

Figure 9B:
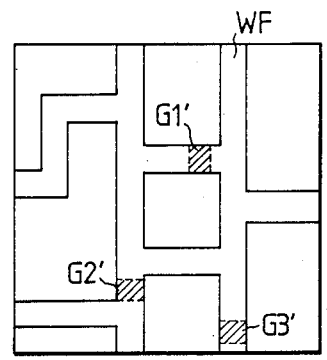

FIG. 9(b) shows the voltages of the two-dimensional parts of the object 3 which are detected with a slightly shifted sampling timing which are displayed by being superposed on the wiring pattern of the object 3. In other words, the voltage distributions indicated at G1, G2 and G3 in FIG. 9(a) are changed to G1' G2' and G3', respectively, in FIG. 9(b).

As is apparent from FIGS. 9(a) and 9(b) with the voltage detecting device 30 of FIG. 8, the variation of the voltage distribution over the wiring pattern of the object 3 can be visually detected by means of the display unit 116. In this manner, the results of detection of the voltages provided at two-dimensional parts of an object under test can be read with ease.

FIG. 10 is an explanatory diagram showing yet another embodiment of a voltage detecting device according to the present invention. In the voltage detecting device 1 of FIG. 10, an electro-optic material 2 is also fixedly positioned in such a manner that it is close to or in contact with an object 3 under measurement. As in the other embodiments, the electro-optic material 2 is large enough to cover a plurality of two-dimensional parts of the object 3, and a reflecting mirror 8 of metal or dielectric multi-layer film is formed on the bottom surface of the electro-optic material 2.

The voltage detecting device 1 comprises a polarizer 204, for extracting a predetermined polarization component from a light beam BM emitted by a light source (not shown), and a micro-lens array 205 for dividing the light beam, which has the polarization component extracted by the polarizer, into a number of rays of light $BM_{ij}$ arranged in matrix form (a checked pattern). A beam splitter 206 is provided to apply the number of rays of light $BM_{ij}$ to the electro-optic material 2 and to reflect a number of emergent rays of light $SG_{ij}$ arranged in matrix form, which are outputted from the electro-optic material 2 after being reflected from the reflecting mirror 8 formed on the bottom surface of the electro-optic material 2. The emergent rays of light $SG_{ij}$ are transmitted toward an analyzer 207 that transmits only the emergent rays of light $SG_{ij}$ having a predetermined polarization component. A detector 209 receives the emergent rays of light that pass through the analyzer 207.

The micro-lens array 205 is made up of a plurality of first rod lenses 210 arranged in a first direction, and a plurality of second rod lenses 211 arranged in a second direction perpendicular to the first direction and laid over the first rod lenses 210 such that a light beam applied thereto is divided into rays of light arranged in matrix form.

The detector 209 comprises a two-dimensional photo-detector such as a CCD camera, photo-diode array, or vidicon camera, or a high-speed response detector such as a streak camera.

In the voltage detecting device 1 of FIG. 10, the electro-optic material 2 is large enough to cover a plurality of two-dimensional parts of the object 3 under test, so that the two-dimensional parts of the electro-optic material which correspond in position to the two-dimensional parts of the object 3 are changed in polarization by voltages provided at corresponding two-dimensional parts of the object 3. Accordingly, when the rays of light $BM_{ij}$ arranged in matrix form and having the predetermined polarization component pass through the parts of the electro-optic material 2, they are changed in polarization by the variations in refractive index of the parts of the electro-optic material 2 and are outputted, as emergent rays of light, from the electro-optic material 2. The emergent rays of light are applied to the analyzer 207 by means of the beam splitter 206. In the case where the analyzer 207 is designed to transmit only a light beam having a polarization component that is perpendicular to the polarization component of the polarizer 204, the emergent rays of light $SG_{ij}$ changed in polarization are made proportional in intensity to $\sin^2[(\pi/2)\cdot V_{ij}/V_0]$ by the analyzer 207 and are then applied to the detector 209. In the expression, $V_{ij}$ is the voltage provided at any one of the two-dimensional matrix parts of the object 3 under test, and $V_0$ is the half-wave voltage.

As is apparent from the above description, the emergent rays of light depend in intensity on the variations in refractive index of the matrix parts of the electro-optic material 2 which are caused by the voltages provided at the corresponding matrix parts of the object 3. Therefore, voltages provided at two-dimensional matrix parts of all the two-dimensional parts (points) of an object under test such as an integrated circuit can be detected simultaneously.

In the above-described example of the voltage detecting device according to the present invention, the micro-lens array 205 is used to form a number of rays of light $BM_{ij}$ arranged in matrix form, and the rays of light thus formed are applied to the electro-optic material 2 to detect the voltages provided at the two-dimensional matrix parts of the object. In some instances, it is desirable that voltages provided at predetermined two-dimensional parts of an object 3 under test be detected.

Figure 11:
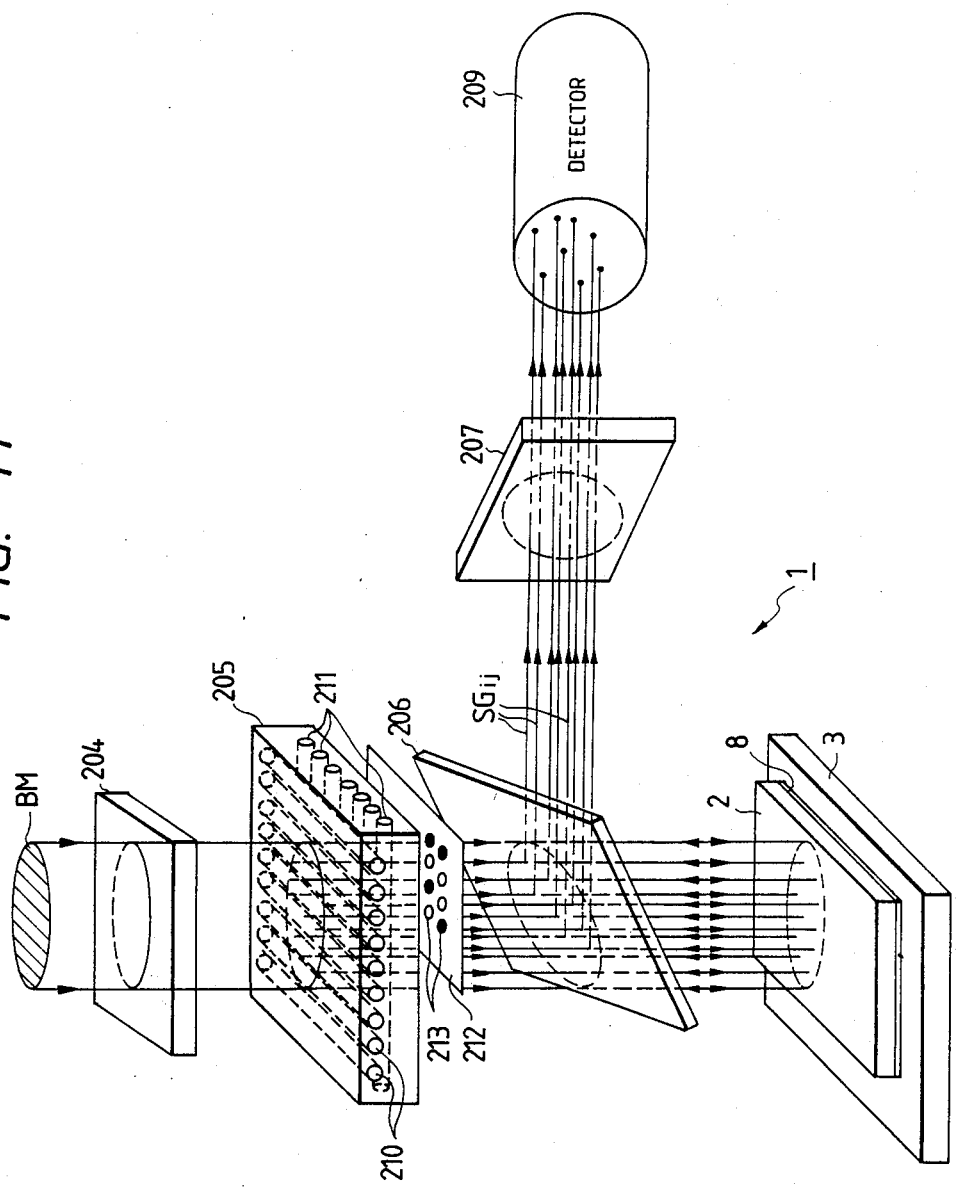
FIG. 11 is an illustration of still further embodiment of a voltage detecting device according to the present invention.
Figure 12:
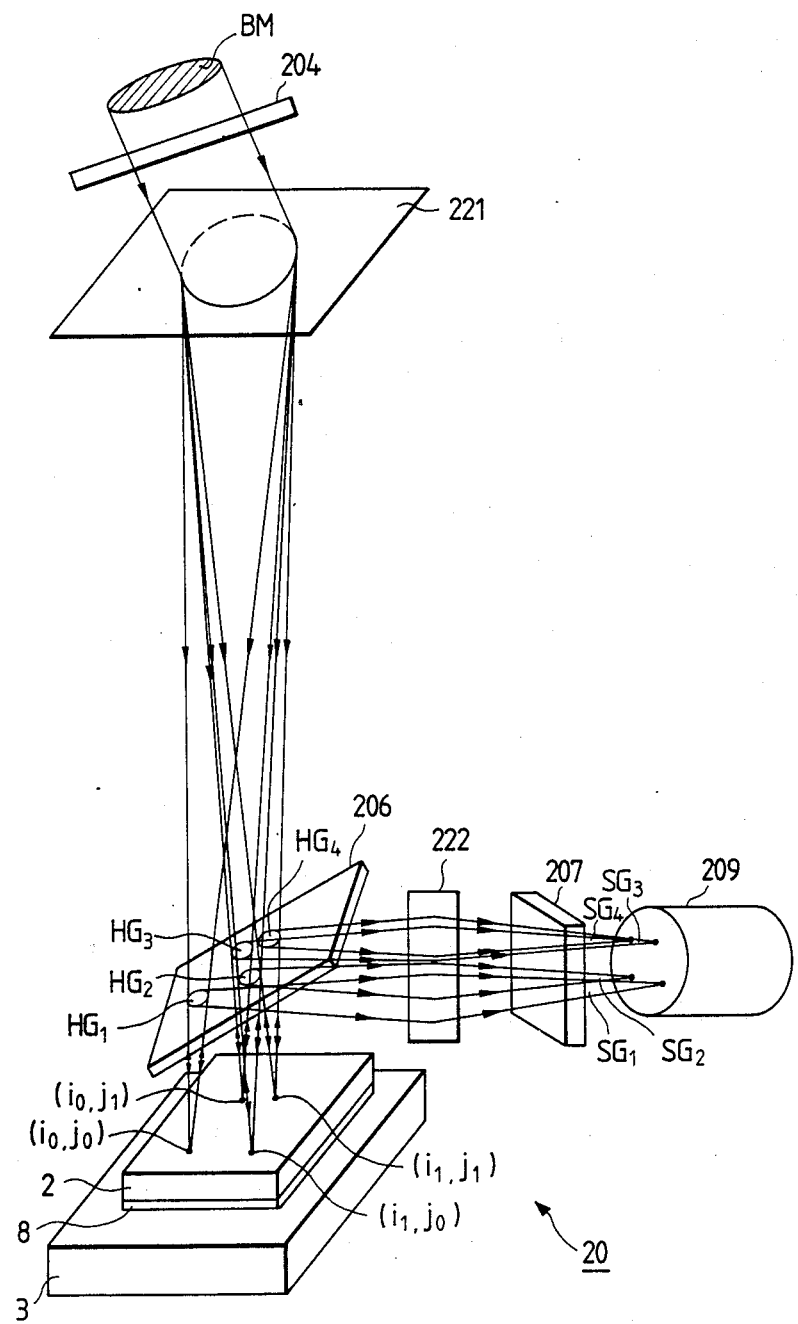
FIG. 12 is an illustration of still further embodiment of a voltage detecting device according to the present invention.
Figure 13:
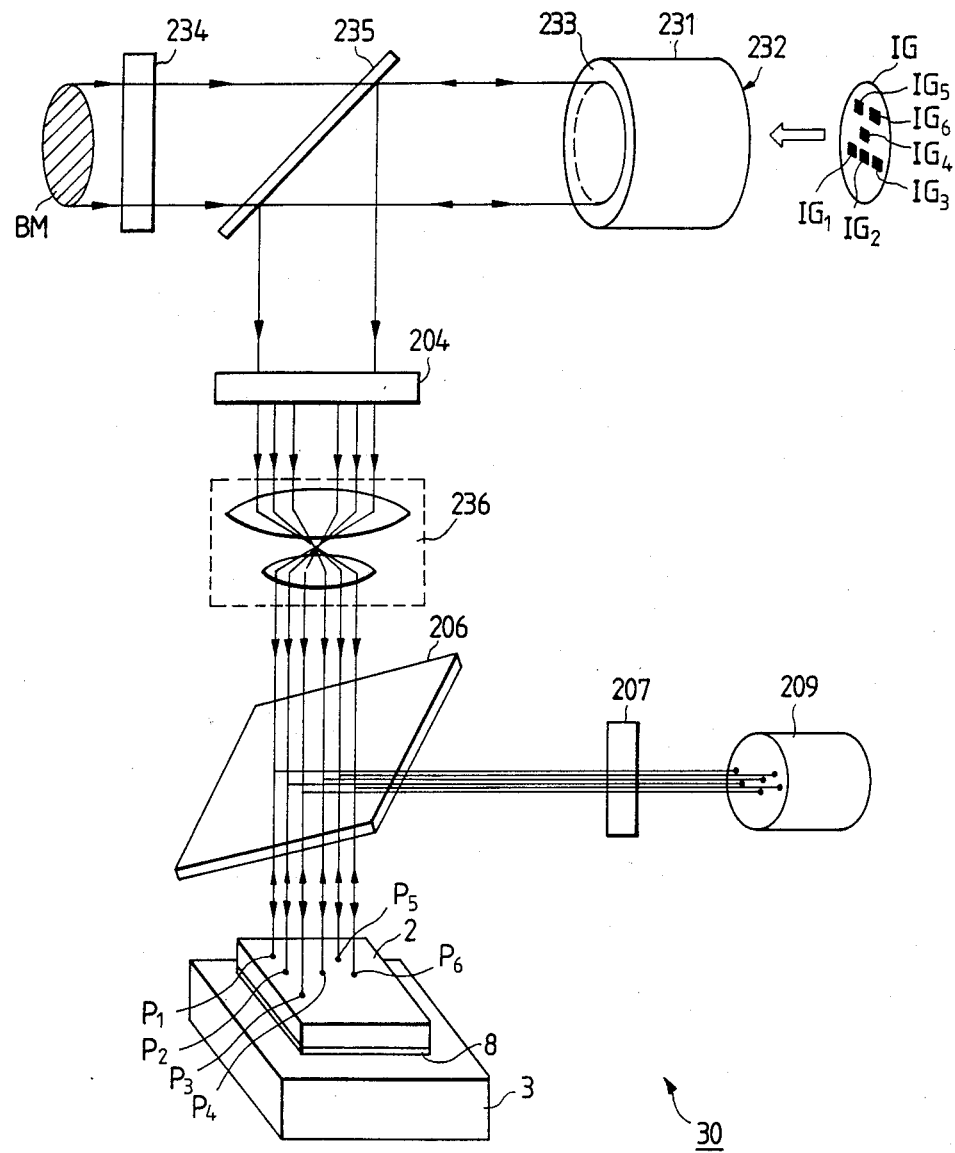
FIG. 13 is an illustration of still further embodiment of a voltage detecting device according to the present invention.

FIGS. 11, 12 and 13 are explanatory diagrams showing three additional embodiments of the voltage detecting device according to the present invention which can detect voltages provided at given two-dimensional parts of an object under measurement. In FIGS. 11, 12 and 3, parts corresponding functionally to those which have been described with reference to FIG. 10 are designated by the same reference numerals or characters.

In the voltage detecting device 1 of FIG. 11, a plate-shaped mask 212 is disposed between the micro-lens array 205 and the beam splitter 206. The mask 212 has a number of holes 213 arranged in matrix form. Some of the holes 213 are closed to provide a desired light beam pattern. With the mask 212, only desired rays of light are applied to the electro-optic material 2 to detect voltages at desired two-dimensional parts of the object 3.

In the voltage detecting device 20 of FIG. 12, instead of the micro-lens array 205, a holographic lens 221 is used to focus the light beam on only predetermined two-dimensional parts $(i_0, j_0)$, $(i_1, j_0)$, $(i_0, j_1)$ and $(i_1, j_1)$ of the electro-optic material 2. If, in this connection, the distance between the holographic lens 221 and the electro-optic material 2 is increased, and the distances between the electro-optic material 2 and the beam splitter 206 and the detector 209 are decreased, then a satisfactory optical system can be obtained.

In the voltage detecting device, the light beam BM having the predetermined polarization component is applied to the holographic lens 221 by means of the polarizer 204, so that the holographic lens 221 provides reproduced images $HG_1$ through $HG_4$ according to its hologram record. These reproduced images $HG_1$ through $HG_4$ are applied through the beam splitter 206, as incident rays of light, to predetermined two-dimensional part $(i_0, j_0)$, $(i_1, j_0)$, $(i_0, j_1)$ and $(i_1, j_1)$ of the electro-optic material, respectively. The reproduced images, namely, rays of light $HG_1$ through $HG_4$ applied to those two-dimensional parts of the electro-optic material 2 are changed in polarization by the refractive indexes of the two-dimensional parts of the electro-optic material 2 which are changed by voltages provided at the two-dimensional parts of the object 3 that are just below the two-dimensional parts or the electro-optic material 2. The incident rays of light $HG_1$ through $HG_4$, which have been changed in polarization, are outputted as emergent rays $SG_1$ through $SG_4$ from the electro-optic material 2. These emergent rays of light $SG_1$ through $SG_4$ are applied through an image-forming optical system 222 and the analyzer 7 to the detector 209 by means of the beam splitter 206, whereby the voltages at the two-dimensional part of the object 3 can be detected. By changing the hologram record of the holographic lens 221, voltages at desired two-dimensional parts of the object 3 can be readily detected.

In the voltage detecting device 230 of FIG. 13, instead of the micro-lens array 205, a spatial light modulator 231 is used.

The spatial light modulator 231 is so designated that when an input image IG is applied to its input surface 232, a light beam applied to its output surface is outputted, in a pattern corresponding to the input image IG, from the output surface 233. In other words, when a light beam BM having a predetermined polarization component, which has been extracted by a polarizer 234, is applied through a beam splitter 235 to the output surface 233 of the spatial light modulator 231, the light beam BM is reflected, in a pattern corresponding to the input image IG, from the spatial light modulator 231. The light beam thus reflected is applied through the beam splitter 235 to the polarizer 204, where a predetermined polarization component is extracted. The light beam thus treated is applied through a reducing optical system 236 and the beam splitter 206 to the electro-optic material 2.

When, in the voltage detecting device 30 thus organized, an input image IG consisting of image parts $IG_1$ through $IG_6$ is applied to the input surface 232 of the spatial light modulator 231, then the light beam is reflected, in a pattern corresponding to the image parts $G_1$ through $IG_6$, from the output surface 233 of the spatial light modulator 231, and applied, as incident rays of light, to the corresponding two-dimensional parts $P_1$ through $P_6$ of the electro-optic material. As described above, when the light beam is applied to the polarizer 204, the predetermined polarization component is extracted. The incident rays of light are changed in polarization by the refractive indexes of the two-dimensional parts $P_1$ through $P_6$ by the variation in refractive index of the two-dimensional parts $P1$ through $P_6$ of the electro-optic material 2 which are caused by the voltages provided at the two-dimensional parts $P_1$ through $P_6$ of the electro-optic material 2, and are then outputted as emergent rays of light from the electro-optic material The emergent rays -of light from the electro-optic material 2 are applied through the analyzer 207 to the detector 209 by means of the beam splitter 206, so that the voltages at the two-dimensional parts of the object 3 which correspond to the parts $IG_1$ through $IG_6$ of the input image IG, respectively, can be detected. Since the pattern of the input image IG can be changed freely, voltages at given two-dimensional parts of the object 3 can be detected.

In the above-described additional embodiments of the voltage detecting device of the present invention, the incident rays of light can be applied to selected two-dimensional parts of the electro-optic material 2, and voltages provided at the object 3 can be detected simultaneously.

What is claimed is:

1. A voltage detecting device for detecting voltages in an object to be measured, comprising:

an electro-optic material for covering a plurality of positions of the object to be measured, and having a refractive index which varies according to a voltage applied thereto;

a light source for emitting a light beam through said electro-optic material toward the oojecr ro oe measured;

scanning means, including deflective means for deflecting said light beam emitted by said light source over a plurality of parts on said electro-optic material corresponding to said plurality of positions of the object to be measured; and detecting means for receiving an emergent light beam from said electro-optic material and detecting voltages at said plurality of positions of the object to be measured according to changes in polarization of said emergent light beam caused by changes in said refractive index of said electro-optic material.

2. A voltage detecting device according to claim 1, wherein said scanning means includes moving means for moving said object to be measured and said electro-optic material in a plurality of directions.

3. A voltage detecting device according to claim 1, wherein said light beam applied to said electro-optic material is focused thereon.

4. A voltage detecting device according to claim 1, wherein said detecting means is a high-speed response detector.

5. A voltage detecting according to claim 4, wherein said high-speed response detector is a streak camera.

* * * * *

UNITED STATES PATENT AND TRADEMARK OFFICE
CERTIFICATE OF CORRECTION

PATENT NO. : 4,906,922

DATED : March 06, 1990

INVENTOR(S) : Hironori Takahashi et al.

It is certified that error appears in the above-identified patent and that said Letters Patent is hereby corrected as shown below:

Claim 1, Column 18, Line 9, "oojer ro oe" should be --object to be--.

Signed and Sealed this

Seventeenth Day of November, 1992

Attest:

DOUGLAS B. COMER

*Attesting Officer*   Acting Commissioner of Patents and Trademarks